United States Patent
Sogard

(10) Patent No.: US 7,162,881 B2
(45) Date of Patent: Jan. 16, 2007

(54) THERMOPHORETIC WAND TO PROTECT FRONT AND BACK SURFACES OF AN OBJECT

(75) Inventor: Michael Sogard, Menlo Park, CA (US)

(73) Assignee: Nikon Corporation, Tokyo (JP)

( * ) Notice: Subject to any disclaimer, the term of this patent is extended or adjusted under 35 U.S.C. 154(b) by 45 days.

(21) Appl. No.: 10/819,509

(22) Filed: Apr. 7, 2004

(65) Prior Publication Data

US 2005/0223718 A1 Oct. 13, 2005

(51) Int. Cl.
*F25B 13/06* (2006.01)

(52) U.S. Cl. ............................................. 62/63; 62/293

(58) Field of Classification Search ................... 62/63, 62/169, 170, 293; 134/1, 103, 184, 902
See application file for complete search history.

(56) References Cited

U.S. PATENT DOCUMENTS

| | | | | |
|---|---|---|---|---|
| 4,597,551 A | * | 7/1986 | Ciechanowski et al. | 248/314 |
| 4,687,242 A | * | 8/1987 | Van Rooy | 294/64.1 |
| 4,744,594 A | * | 5/1988 | Poli et al. | 294/64.1 |
| 5,158,690 A | * | 10/1992 | Batchelder et al. | 210/775 |
| 5,172,949 A | * | 12/1992 | Nagai et al. | 294/64.1 |
| 5,217,273 A | * | 6/1993 | Hendricsen et al. | 294/64.1 |
| 5,314,538 A | * | 5/1994 | Maeda et al. | 118/715 |
| 5,783,754 A | * | 7/1998 | MacPherson | 73/862.03 |
| 6,051,169 A | * | 4/2000 | Brown et al. | 264/40.1 |
| 6,072,157 A | * | 6/2000 | Klebanoff et al. | 219/228 |
| 6,136,156 A | * | 10/2000 | El-Shall et al. | 204/157.41 |
| 6,232,578 B1 | | 5/2001 | Klebanoff et al. | 219/228 |
| 6,242,718 B1 | * | 6/2001 | Ferro et al. | 219/405 |
| 6,430,263 B1 | * | 8/2002 | Lu et al. | 378/140 |
| 6,604,365 B1 | * | 8/2003 | Sekimoto et al. | 62/51.1 |

(Continued)

FOREIGN PATENT DOCUMENTS

| | | | |
|---|---|---|---|
| JP | 2001-35826 A | * | 2/2001 |
| JP | 2001-230459 A | * | 8/2001 |

OTHER PUBLICATIONS

M. A. Gallis et al., "Thermophoresis in Rarefied Gas Flows," Aerosol Science and Technology 36, 2002, pp. 1099-1117.

(Continued)

*Primary Examiner*—Mohammad M. Ali
(74) *Attorney, Agent, or Firm*—Aka Chan LLP

(57) ABSTRACT

Methods and apparatus for enabling a clean, fragile object to be transported while protecting both front and back surfaces of the object are disclosed. According to one aspect of the present invention, a thermophoretic wand that is arranged to carry an object having a first temperature includes a first element, a contact surface, and an air supply. The first element has a first opening defined therein, and is maintained at a second temperature that is lower than the first temperature such that when the first element is in proximity to the object, a thermophoretic forces may be such that particles present between the object and the first element are driven away from the object. The air supply applies a vacuum of a first level through the first opening to suction the object against the contact surface.

12 Claims, 9 Drawing Sheets

U.S. PATENT DOCUMENTS

| | | | | |
|---|---|---|---|---|
| 6,663,333 B1 * | 12/2003 | Kinnard et al. | ............. | 414/217 |
| 6,704,496 B1 * | 3/2004 | Jacobson et al. | ............ | 392/418 |
| 6,860,533 B1 * | 3/2005 | Lee et al. | .................. | 294/64.1 |
| 6,861,321 B1 * | 3/2005 | Keeton et al. | ............... | 438/308 |
| 2004/0182416 A1 * | 9/2004 | Allen et al. | .................. | 134/1.3 |

OTHER PUBLICATIONS

Daniel E. Dedrick et al., "Verification Studies of Thermophoretic Protection for Extreme Ultraviolet Masks," J.Vac. Sci. Technol. B, vol. 23, No. 1, Jan./Feb. 2005, pp. 307-317.

* cited by examiner

THERMOPHORETIC WAND TO PROTECT FRONT AND BACK SURFACES OF AN OBJECT

BACKGROUND OF THE INVENTION

1. Field of Invention

The present invention relates generally to equipment used in semiconductor processing. More particularly, the present invention relates to a thermophoretic wand which enables front and back surfaces of an object to be protected from particles while being transported.

2. Description of the Related Art

In extreme ultraviolet (EUV) lithography, as well in other lithography processes, clean, fragile items such as wafers or reticles must be handled such that critical surfaces of the items remain relatively uncontaminated by particles and are not subjected to factors, e.g., bending moments or excessive heat, which may adversely affect the integrity of the items. In the case of reticles used in EUV lithography, pellicles are generally not suitable for use in protecting patterned surfaces of the reticles, as will be appreciated by those skilled in the art. Various tools, as for example thermophoretic vacuum wands, have been developed for use in handling items such as wafers and reticles to reduce the likelihood that items such as EUV reticles may become contaminated with particles or have their integrity otherwise compromised.

Thermophoresis refers to a force which occurs in a temperature gradient, and causes particles in the temperature gradient to move from a hotter region to a colder region. That is, thermophoresis involves the attraction of particles to colder areas. Hence, a thermophoretic vacuum wand is generally heated, and therefore warms an object that is to be carried by the wand relative to the environment surrounding the object to create a thermophoretic force which often repels airborne particles from the surface of the object.

FIG. 1a is a diagrammatic representation of a thermophoretic wand or holder which is arranged to carry an object such that top or front surface of the object, i.e., the surface of the object that is exposed while carried on the wand, is substantially protected from particle contaminants. A thermophoretic wand 100 generally includes a head area 104 which is arranged to support an object (not shown). Head area 104 includes a plurality of openings 106 through which a vacuum may be applied. The vacuum may be provided through a line 116 that is controlled or otherwise regulated by a valve 120. The application of a vacuum through openings 106 allows an object (not shown) to be held against head area 104.

Wand 100 includes an electric heater which is powered by electrical line 112, and is arranged to heat the surface of head 104. FIG. 1b is a diagrammatic cross-sectional side view representation of a head of a wand, i.e., head 104 of wand 100 of FIG. 1a, which includes an electric heater. By heating the surface of head 104, an object 138 that is ultimately clamped to head 104 is also heated, typically to a temperature that is higher than an ambient temperature around wand 100. Hence, thermophoretic forces protect a top surface 142 of object 138 that is exposed to the environment from particles by causing any particles near top surface 142 to effectively be attracted away from exposed top surface 138 to the cooler surrounding environment.

Head 104 includes an electric heater 132 which is arranged to heat a platen 126 and, hence, a top surface 117 of platen 126, to a temperature that is higher than a surrounding environmental temperature to create thermophoretic forces to drive particles away from top surface 142 of object 138 when object 138 is effectively suctioned against top surface 117 of platen 126.

While heating object 138 is generally effective in substantially repelling particles from top surface 142, top surface 117 is often warmer than a back surface 139 of object 138, particularly prior to contact being made between top surface 117 and back surface 139. When top surface 117 is warmer than back surface 139, and top surface 117 is in proximity to back surface 139, as for example just prior to object 138 being clamped against top surface 117, thermophoretic forces may drive any particles positioned between back surface 139 and top surface 117 towards back surface 139, as back surface 139 is cooler than top surface 117.

In this description and below, a wand is described as contacting and clamping the bottom surface of an object. However, it should be appreciated that a wand may also clamp an object from the top. In such a case, the surfaces described as "top" may be interchanged with "bottom" or "back" surfaces.

With reference to FIGS. 2a and 2b, the attraction of particles to the back surface of an object to be carried on a thermophoretic wand will be described. FIG. 2a is a diagrammatic cross-sectional side view representation of a head of a thermophoretic wand, an object to be carried on the head, and particles near a contact surface of the object. A head 204 of a thermophoretic wand includes a platen 226 that is heated by an electric heater 232 or a heating element. As previously mentioned, by heating platen 226 to a temperature that is higher than that of an environment surrounding the wand, when a back surface 239 of an object 238 is clamped against a top surface 217 of platen 226, object 238 may be heated such that any particles (not shown) near a front or top surface 242 of object 238 are repelled from top surface 242. The onset of a thermophoretic force that effectively protects top surface 242 from particles (not shown) may be delayed if the finite heat capacity of object 242 is such that the temperature rise of object 242 from an initial temperature to a heated temperature is relatively slow. Any delay in the onset of a thermophoretic force may cause some particles (not shown) to come into contact with top surface 242, or may delay usage of the wand.

While particles (not shown) positioned above top surface 242 of object 238 may be repelled away from object 238 due to thermophoretic forces once object 238 is heated, particles 250 which are located between back surface 239 of object 238 and top surface 217 of platen 226 are often attracted to back surface 239. This attraction may arise when electric heater 232 heats platen 226 to a temperature that is higher than the temperature of object 238, and thermophoretic forces cause particles 250 to be attracted to back surface 239. When such an attraction occurs, particles 250 may be "stuck" to back surface 239, and remain stuck to back surface 239 even after object 238 is heated by head 204 to create thermophoretic forces to repel particles (not shown) away from top surface 242 of object 238, as shown in FIG. 2b.

Particles 250 may remain substantially stuck to back surface 239 of object 238 when object 238 is removed from head 204. When particles 250 remain stuck to back surface 239, and object 238 is used in a process such as an EUV lithography process, the integrity of the process may be compromised. For example, when object 238 is a reticle used in an EUV lithography process and particles 250 are essentially sandwiched between back surface 239 and a chuck on which object 238 is positioned, distortions may be caused in an image projected off of top surface 242, which may be a patterned surface. Alternatively, when object 238 is a wafer, the integrity of object 238 may be compromised if particles 250 affect the accurate positioning of object 238 in a wafer chuck.

In addition to particles 250 adversely affecting processes involving object 238, heating object 238 using head 204 may not be desirable, as raising the temperature of object 238 may cause object 238 to expand or become distorted. Distortions may include thermal distortions on a patterned surface on object 238 when object 238 is a reticle.

Therefore, what is needed is a system and a method which is suitable for use as a holder of a clean, fragile object that does not heat the object and minimizes particle contamination on both top and back surfaces of the object. That is, what is desired is a wand apparatus which protects front and back surfaces of a clean, fragile object without the application of heat to the object.

SUMMARY OF THE INVENTION

The present invention relates to a system and a method for enabling a clean, fragile object to be transported while protecting both front and back surfaces of the object. According to one aspect of the present invention, a thermophoretic wand that is arranged to carry an object having a first temperature includes a first element, a contact surface, and an air supply. The first element has a first opening defined therein, and is maintained at a second temperature that is lower than the first temperature such that when the first element is in proximity to the object, a thermophoretic force may be such that particles present between the object and the first element are driven away from the object. The air supply applies a vacuum of a first level through the first opening to suction the object against the contact surface.

In one embodiment, the thermophoretic wand includes a shield that is positioned over the object when the object is suctioned against the contact surface. In another embodiment, the thermophoretic wand includes an insulator that insulates the object from the first element, and a seal that is arranged over the insulator to prevent vacuum leakage when the object is suctioned against the contact surface.

A thermophoretic wand which allows the temperature of an object that is carried by the wand to be maintained substantially unchanged while providing cooled surfaces near the object minimizes particle contamination on surfaces of the object without causing thermal distortion in the object. Providing a cold surface near a back side of the object allows particles to be attracted away from the back side of the object using thermophoretic forces, while providing a cold shield near a front or top side of the object allows particles to be attracted away from the front side of the object using thermophoretic forces. Hence, both the top and back surfaces of the object may remain relatively uncontaminated by particles while the object is being transported by the thermophoretic wand. By extending the cold shield to cover the sides of the object, essentially the entire surface of the object may be protected from particles.

According to another aspect of the present invention, a method for supporting an object using an apparatus such that particle contamination of a first surface and a second surface of the object is minimized includes maintaining a first cold plate of the apparatus at a temperature which is less than that of the object. The method also includes positioning the apparatus in proximity to the first surface of the object such that the first surface of the object faces the apparatus, and allowing a first thermophoretic force to convey any particles present between the first surface of the object and the apparatus away from the first surface of the object. A vacuum of a first level is then applied through a first opening in the apparatus using a vacuum source to secure the first surface of the object against a contact surface of the apparatus.

In one embodiment, the method also includes applying a vacuum of a second level through the first opening using the vacuum source before the first surface is secured against the contact surface. Applying the vacuum of the second level conveys the particles present between the first surface of the object and the apparatus into the first opening.

According to yet another aspect of the present invention, a thermophoretic wand arranged to carry an object of a first temperature includes a head and a shield. The head includes a first plate, a contact surface, and a vacuum applicator. The first plate maintains a second temperature that is lower than a temperature of an environment surrounding the head and the first temperature. The shield is of a third temperature that is lower than the temperature of the environment and the first temperature, and is configured to be positioned over the head when the object is carried on the head. The temperature gradients created between the object and both the first plate and the shield enable thermophoretic forces to convey any airborne particles in proximity of the object away from the object.

These and other advantages of the present invention will become apparent upon reading the following detailed descriptions and studying the various figures of the drawings.

BRIEF DESCRIPTION OF THE DRAWINGS

The invention may best be understood by reference to the following description taken in conjunction with the accompanying drawings in which.

DETAILED DESCRIPTION OF THE EMBODIMENTS

When airborne particle contaminants come into contact with clean objects such as wafers or reticles used for extreme ultraviolet (EUW) lithography, particle contamination on the surfaces of the objects may occur, thereby compromising the integrity of processes involving the object. By way of example, particle contamination of a patterned surface and particle contamination of a non-patterned surface of an EUV reticle may each cause distortion in a projected image of the patterned surface of the reticle onto a wafer. Conventional thermophoretic vacuum wands, while effective in minimizing particle contamination of one surface of an object, e.g., a patterned surface of a reticle, often actually facilitate particle contamination of an opposing surface of the object, e.g., the non-patterned surface of a reticle. Additionally, such thermophoretic vacuum wands typically heat objects relative to the surrounding environment in order to create a thermophoretic force to minimize particle contamination, which is often not desirable as thermal distortion may result.

By maintaining the temperature of an object to be transported on or manipulated by a thermophoretic vacuum wand at a desired level, while protecting both a top or front surface and a back surface of the object, particle contamination may be minimized substantially without introducing potential thermal distortion. In one embodiment, a thermophoretic wand is arranged to be cooler than an object to be carried, such that a thermophoretic force drives particles away from the back surface of the object and toward a wand surface to minimize particle contamination of the back surface of the object. The wand may also use a slight vacuum to further suction particles away from the back surface of the object and the wand surface such that particles are not trapped between the back surface of the object and the wand surface. The wand may include a cold shield that is cooled to a temperature that is less than the temperature of the object. The cold shield may be positioned over a front surface of the object such that thermophoretic forces drive particles away from the front surface towards the cold shield in order to minimize particle contamination of the front surface of the object. Such a wand minimizes particle contamination of both a top or front surface and a back surface of an object without heating the object.

Figure 1A:
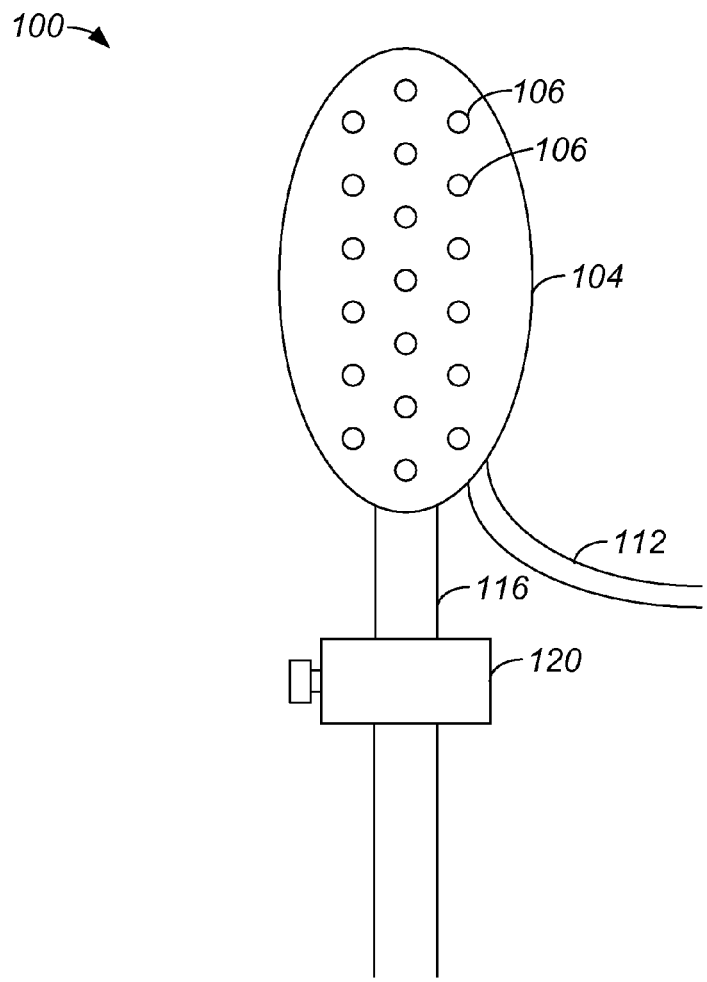
FIG. 1*a* is a diagrammatic top view representation of a thermophoretic vacuum wand.
Figure 1B:
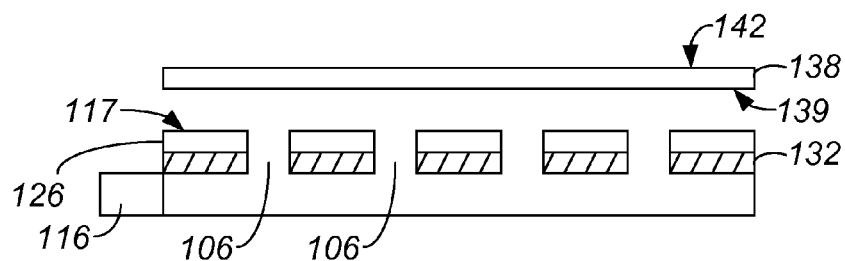
FIG. 1*b* is a diagrammatic cross-sectional side view representation of a head of a thermophoretic wand, i.e., thermophoretic wand 100 of FIG. 1*a*, and an object to be carried on the thermophoretic wand.
Figure 2A:
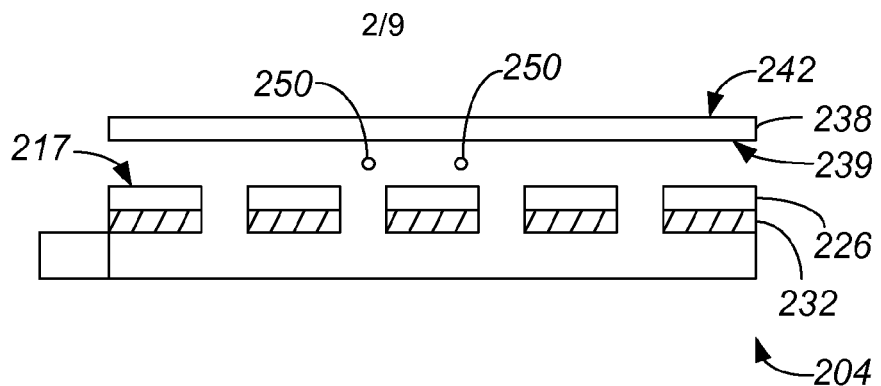
FIG. 2*a* is a diagrammatic cross-sectional side view representation of a head of a thermophoretic wand, an object to be carried on the head, and particles near a contact surface of the object.
Figure 2B:
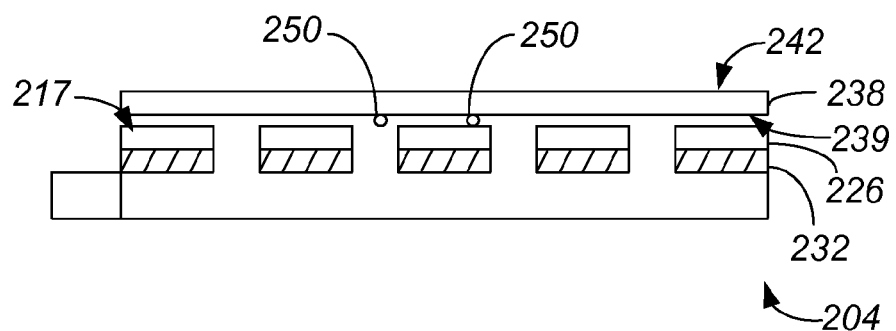
FIG. 2*b* is a diagrammatic cross-sectional side view representation of a head of a thermophoretic wand, i.e., head 204 of FIG. 2*a*, an object carried on the head, and particles attracted to contact surface of the object.
Figure 3A:
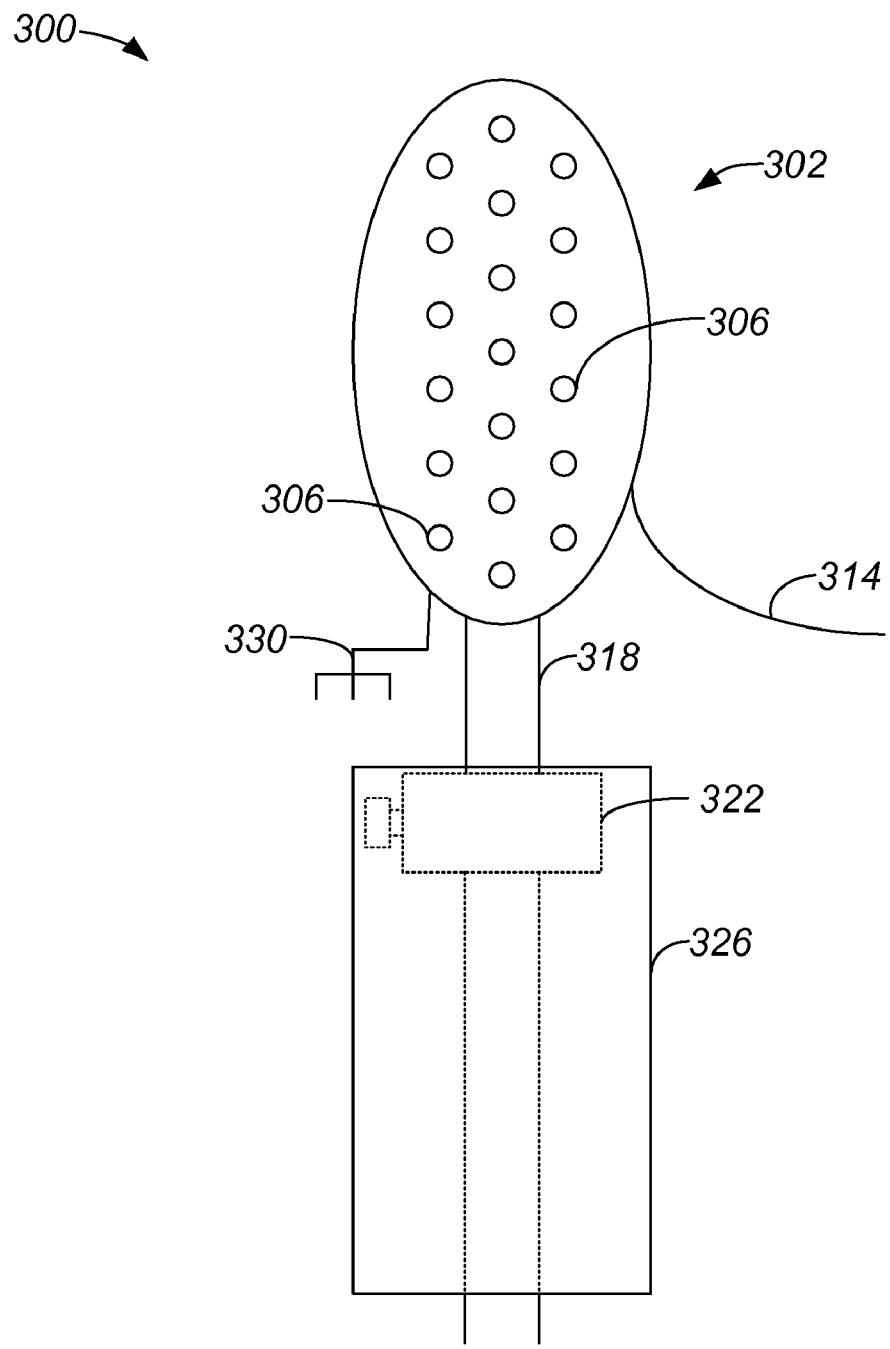
FIG. 3*a* is a diagrammatic top view representation of a thermophoretic wand with a cold shield in a retracted position in accordance with an embodiment of the present invention.

FIG. 3a is a diagrammatic top view representation of a non-heating thermophoretic wand with a cold shield in a retracted position in accordance with an embodiment of the present invention. A thermophoretic wand 300 includes a head area 302 which is arranged to support an object. Head area 302 includes openings 306 or ports through which a vacuum or a negative air pressure may be applied through a vacuum supply line 318 that is controlled by a valve 322 or similar controlling device which regulates the vacuum applied through openings 306.

In the embodiment as shown, head 302 is cooled to a desired temperature using a coolant which is provided through a cooling control line 314. A surface of head 302 which is arranged to come into contact with an object to be carried by wand 300 is maintained at a temperature that is slightly lower than a temperature of the object such that any airborne particles between the surface of head 302 and the object may be substantially prevented from being attracted to the object. A grounding line 330 enables wand 300, as well as an object carried by wand 300, to be substantially grounded.

Figure 3B:
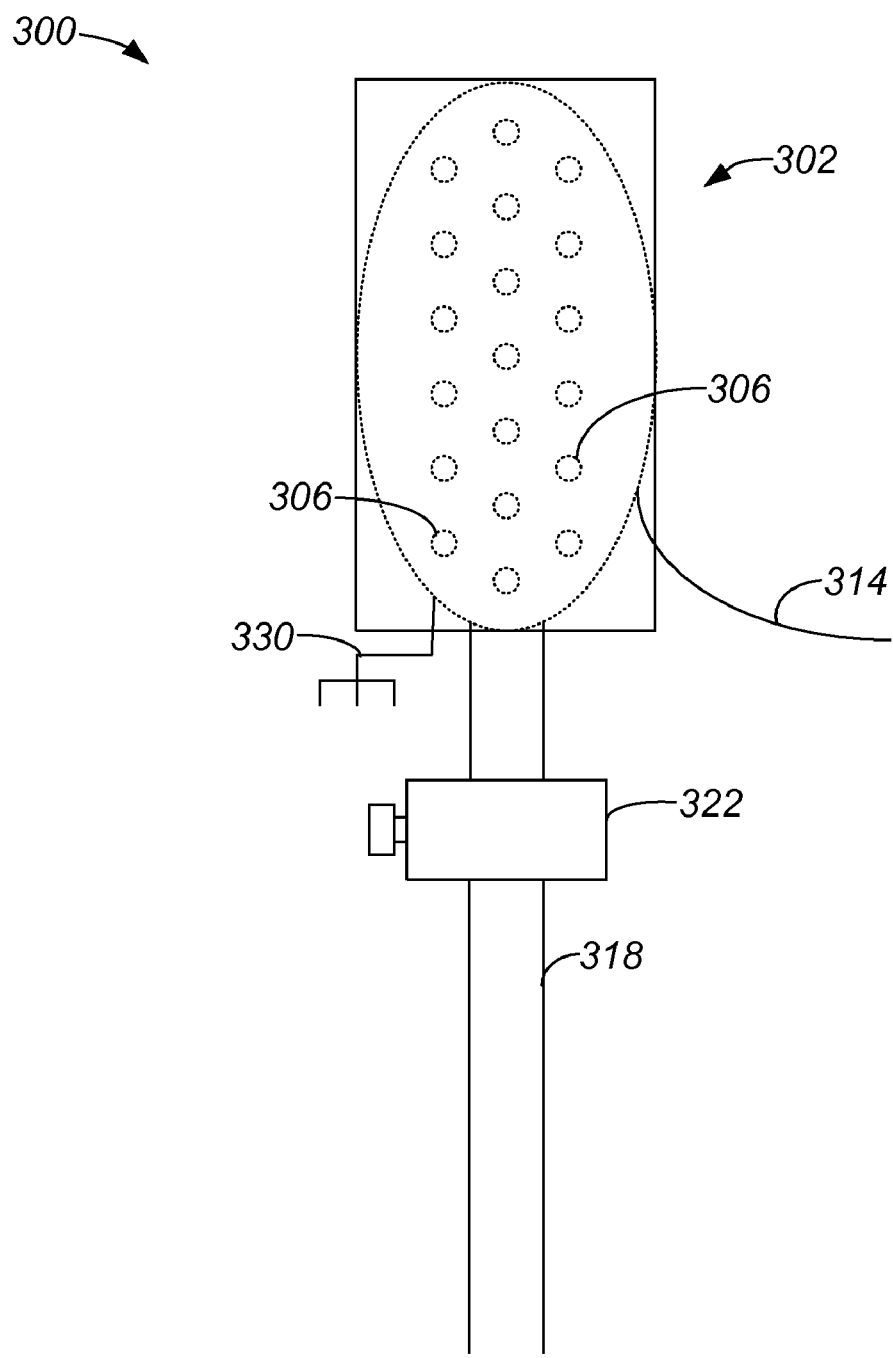
FIG. 3*b* is a diagrammatic top view representation of a thermophoretic wand, i.e., thermophoretic wand 300 of FIG. 3*a*, with a cold shield in a non-retracted position in accordance with an embodiment of the present invention.

Wand 300 includes a cold shield 326 which is arranged to be positioned over head 302, as shown in FIG. 3b, when an object (not shown) is clamped to head 302 by a vacuum provided through openings 306. Cold shield 326 may be arranged to be lifted and positioned over head 302, or to be slid into position over head 302.

Figure 4A:
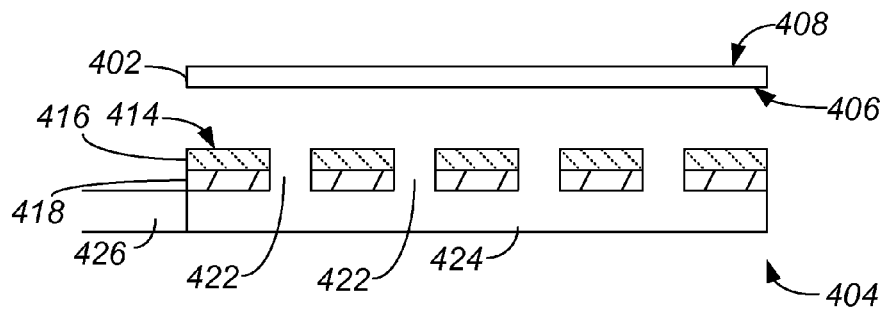
FIG. 4*a* is a diagrammatic cross-sectional side view representation of the head of a thermophoretic wand and an object to be carried on the head in accordance with an embodiment of the present invention.

As previously mentioned, head 302 is arranged to be cooled to substantially minimize the conduction of heat between head 302 and a back surface of an object to be cooled by wand 300. With reference to FIG. 4a, which is a diagrammatic cross-sectional side-view representation of the head portion of a thermophoretic wand, mechanisms used to enable a head to be cooled will be described in accordance with an embodiment of the present invention. A head portion 404 of a thermophoretic wand arrangement is arranged such that a top surface 414 of a thermal insulator 416 of head portion 404 is arranged to make contact with a back surface 406 of an object 402 to be held by head 404.

Object 402 may be substantially any object such as a reticle or a wafer. It should be appreciated that when object 402 is an EUV reticle, a front or top surface 408 of object 402 is generally the patterned side of object 402, while back surface 406 of object 402 generally is not the patterned side of object 402. More generally, if an object such as object 402 has two surfaces which are sensitive to particle contamination, but a first surface requires a substantially greater degree of protection from particles than a second surface, the first surface is typically top surface 408.

Thermal insulator 416 is generally formed from substantially any insulating material that effectively minimizes heat conduction between top surface 414 and back surface 406. In one embodiment, the material used to form thermal insulator 416 is compatible with requirements for clean room applications and, hence, may be glass, ceramic or plastic. Thermal insulator 416 is arranged to prevent the temperature of object 402 from being significantly lowered by the presence of a cold plate 418. Thermal insulator 416 is positioned over a cold plate 418 that is arranged to provide a cool surface that attracts particles away from back surface 406 of object 402 when object 402 is clamped to head 404. In one embodiment, cold plate 418 may be formed from a highly conductive material, e.g., copper, and cooled by using a coolant that is controlled by a controller. It should be appreciated, however, that cold plate 418 may instead be cooled by placing head 404 in a cooling block or holder when the overall wand is not in use.

Openings 422 are formed in thermal insulator 416 and cold plate 418 through which a vacuum may be applied. Vacuum may be provided through a line 426 that is coupled to head 404 or, more specifically, a chamber 424 of head 404. A "clamping" vacuum may be applied through openings 422, which are in fluid communication with line 426 through chamber 424, in order to effectively suction back surface 406 of plate against top surface 414 of thermal insulator 416. A lower level of vacuum may be applied through openings 422 to facilitate the movement of any particles present between back surface 406 and top surface 414 away from back surface 406. That is, the lower level of vacuum may be applied through openings 422 to provide an air flow that provides a small suction force that conveys particles present between back surface 406 and top surface 414 through openings 422.

Figure 4B:
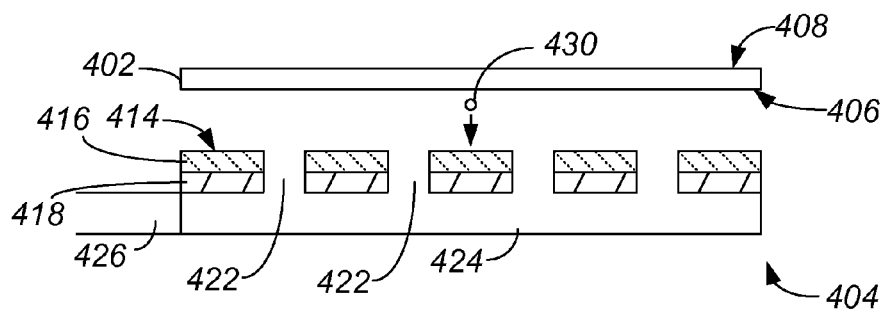
FIG. 4*b* is a diagrammatic cross-sectional side view representation of the head of a thermophoretic wand, i.e., head 404 of FIG. 4*a*, an object to be carried on the head, and a particle positioned between a back surface of the object and the head before a slight vacuum has been applied in accordance with an embodiment of the present invention.
Figure 4C:
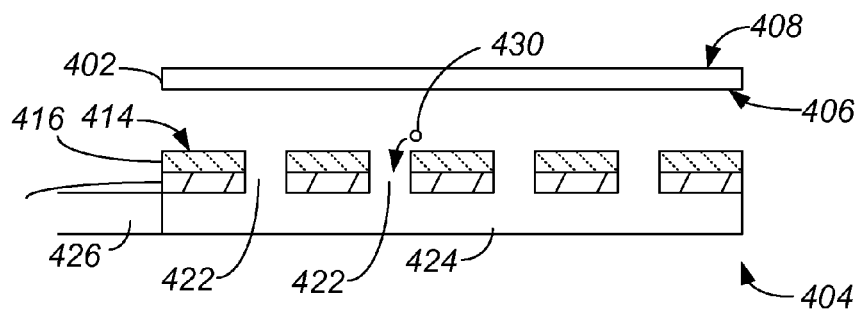
FIG. 4c is a diagrammatic cross-sectional side view representation of the head of a thermophoretic wand, i.e., head 404 of FIG. 4a, an object to be carried on the head, and a particle positioned between a back surface of the object and the head after a slight vacuum has been applied in accordance with an embodiment of the present invention.

When a particle, e.g., particle 430 as shown in FIG. 4b, is located between bottom surface 406 and top surface 414, thermophoresis generally causes particle 430 to move away from a hotter region or surface towards a cooler region or surface. Since object 402 is at a warmer temperature than cold plate 418, thermophoretic forces generally drive particle 430 towards head 404. The application of a slight amount of vacuum causes air flow to convey particle 430 into an opening 422, as shown in FIG. 4c. Since particle 430 is conveyed by the flow of air into an opening 422, particle 430 is not likely to be trapped between back surface 406 and top surface 414 when contact between back surface 406 and top surface 414 is made, i.e., after a higher level of vacuum, is applied through openings 422 to effectively clamp object 402 to head 404. In one embodiment, the change from a low level vacuum to a high level vacuum may be effected by means of a non-contact proximity switch built into the head 404 and actuated by the approach of the head 404 to an object 402, although it should be appreciated that substantially any suitable mechanism and method may be used to effect a change from a low level vacuum to a high level vacuum.

By preventing particles like particle 430 from becoming substantially sandwiched between object 402 and head 404, the likelihood of particles being present on back surface 406 after object 402 is removed from head 404 is reduced. Hence, when object 402 is subsequently placed in a chuck, for example, particles are less likely to be present to effectively distort object 402, or cause images projected off of top surface 408 to be distorted if object 402 is an EUV reticle.

Figure 5A:
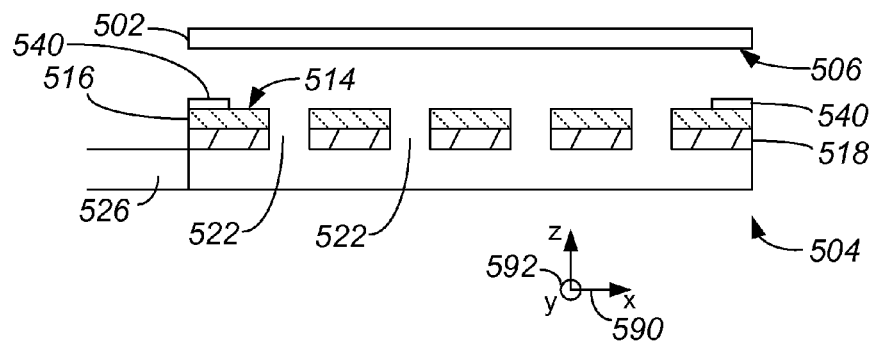
FIG. 5a is a diagrammatic cross-sectional side view representation of a head of a thermophoretic wand which includes a peripheral seal and an object that is to be carried on the head in accordance with an embodiment of the present invention.

In one embodiment, in order to ensure that a vacuum may be maintained between a wand head and an object while effectively further reducing the likelihood of particle contamination on a back surface of the object, a peripheral seal may be added to the wand head. FIG. 5a is a diagrammatic cross-sectional side-view representation of a head of a thermophoretic wand which includes a peripheral seal in accordance with an embodiment of the present invention. A head portion 504 of a thermophoretic wand arrangement includes a cold plate 518 and an insulator 516 through which openings 522 are defined. Openings 522 are arranged to enable a vacuum to be applied, e.g., through an air flow line 526, to suction particles away from back surface 506 of object 502 and to effectively clamp object 502 to head 504.

Head 504 also includes a peripheral seal 540 which is positioned atop insulator 516 such that when object 502 is clamped to head 504, e.g., by a vacuum force, peripheral seal 540 is positioned between object 502 and head 504. Specifically, peripheral seal 540 is arranged such that object 502 and insulator 516 both contact peripheral seal 540 when object 502 is clamped to head 504, while object 502 and insulator 516 do not come into direct contact, as shown in FIG. 5b.

Peripheral seal 540 may be positioned substantially about the edge of head 504 such that the outer perimeter of head 504 is effectively covered by peripheral seal 540. Peripheral seal 540 may be formed from substantially any suitable material which allows a seal to effectively be formed between head 504 and object 502 when object 502 is clamped to head 504. By way of example, peripheral seal 540 may be formed from a viscoelastic material such that peripheral seal 540 may function as an o-ring. Alternatively, peripheral seal 540 may be formed from the same material as insulator 516 and may, additionally, effectively be a raised ridge around the periphery of insulator 516 instead of a substantially separate piece.

By essentially minimizing the area of back surface 506 which come into direct contact with any part of head 504, in addition to providing a slight vacuum through openings 522 in order to convey particles (not shown) positioned between back surface 506 and head 504 into openings 522, particle contamination of back surface 506 may be further reduced. Minimizing the contact area between back surface 506 and head 504 reduces the likelihood of any particles which may not be suctioned into openings 522 becoming substantially attached to back surface 506 due to contact between back surface 506 and a top surface 514 of insulator 516. In other words, possible particle contamination may be further minimized when the area of contact between back surface 506 and head 504 is substantially minimized.

Figure 5B:
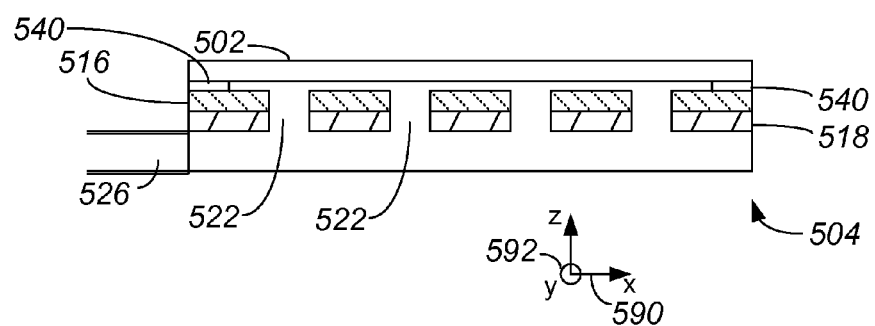
FIG. 5b is a diagrammatic cross-sectional side view representation of the head of a thermophoretic wand which includes a peripheral seal, i.e., head 504 of FIG. 5a, with an object carried on the head in accordance with an embodiment of the present invention.

When object 502 has substantially the same shape as head 504 relative to an x-axis 590 and a y-axis 592, and is of approximately the same size, e.g., has approximately the same dimensions relative to x-axis 590 and y-axis 592 as head 504, then peripheral seal 540 may be located substantially at the outer edge of both object 502 and head 504, as shown in FIG. 5b. It should be appreciated, however, that if object 502 is larger than head 504, e.g., is wider or longer than head 504, peripheral seal 540 is still arranged to provide a seal between back surface 506 and head 504. In order for a seal between back surface 506 and head 504 to be provided when object 502 is smaller along x-axis 590 and y-axis 592 than head 504, peripheral seal 504 may be moved away from the edges of head 504.

Figure 6A:
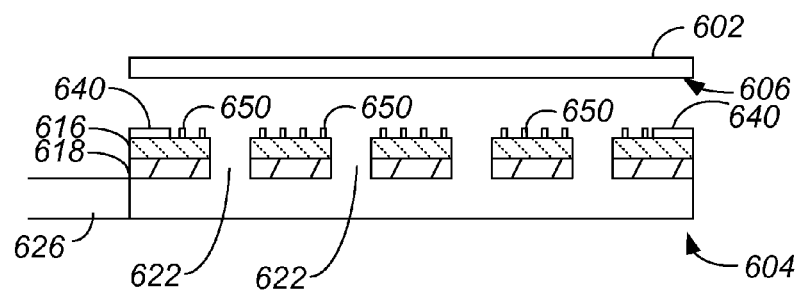
FIG. 6a is a diagrammatic cross-sectional side view representation of a head of a thermophoretic wand which includes a peripheral seal and pin chucks, and an object that is to be carried on the head in accordance with an embodiment of the present invention.
Figure 6B:
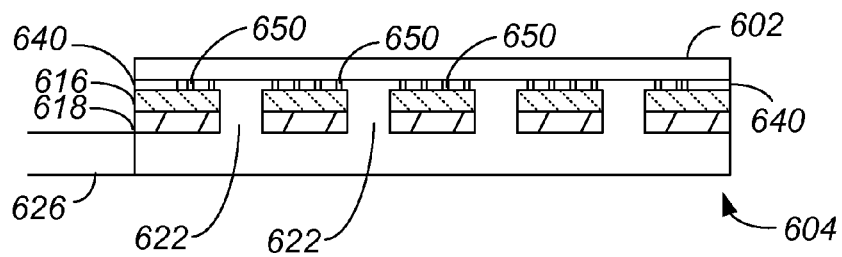
FIG. 6b is a diagrammatic cross-sectional side view representation of the head of a thermophoretic wand which includes a peripheral seal and pin chucks, i.e., head 604 of FIG. 6a, with an object carried on the head in accordance with an embodiment of the present invention.

When it is desired to support an object against more than a peripheral seal while the object is clamped against a head of a wand using suction or a vacuum, e.g., when the flatness maintained by the object while the object is clamped is crucial, a pinchuck arrangement may be used in addition to support the object while still maintaining a relatively small overall contact area between the back of the object and the head. Referring next to FIGS. 6a and 6b, a thermophoretic wand with a head portion which includes both a peripheral seal and a pinchuck arrangement will be described in accordance with an embodiment of the present invention. A head portion 604 of a thermophoretic wand arrangement includes a cold plate 618, an insulator 616, a peripheral seal 640, and pinchucks 650. Pinchucks 650 are positioned on insulator 616 such that when a back surface 606 of an object 602 is supported on head 604, back surface 606 is supported on pinchucks 650 and, peripherally, on peripheral seal 640, as shown in FIG. 6b. To facilitate the support of object 602, pinchucks 650 are generally of approximately the same height as peripheral seal 640.

Pinchucks 650 cooperate with peripheral seal 640 to support object 602 while a vacuum, which is supplied by a line 626, is applied through openings 622 to substantially hold back surface 606 of object 602 against pinchucks 650 and peripheral seal 640. The use of pinchucks 650 in addition to peripheral seal 640 allows object 602 to remain relatively flat while object 602 is supported on head 604, without significantly increasing the area of contact between back surface 606 and head 604. As a result, there is typically no significant increase in the likelihood of particle contamination on back surface 606.

In one embodiment, pinchucks 650 may be formed from the same material as insulator 616 such that heat conduction between insulator 616 and a back surface 606 of an object 602 that is supported on head 604 or, more specifically, pinchucks 650 and peripheral seal 640. It should be appreciated that pinchucks 650 may have substantially any suitable size and shape. By way of example, the surface areas of pinchucks 650 may vary widely. In addition, the number of pins on pinchucks 650 on head 604 may also vary widely.

As discussed above with respect to FIGS. 3a and 3b, a thermophoretic wand may utilize a cold shield to minimize particle contamination of a top or front surface of an object that is carried by the wand. The cold shield, like the cold plate of the thermophoretic wand, is typically cooled to a temperature that is at least a few degrees colder than the temperature of the object that is to be carried on the wand. By positioning the cold shield over the top surface of the object without touching the object, airborne particles which are present between the object and the cold shield will generally be driven by thermophoretic forces towards the cold shield.

Figure 7A:
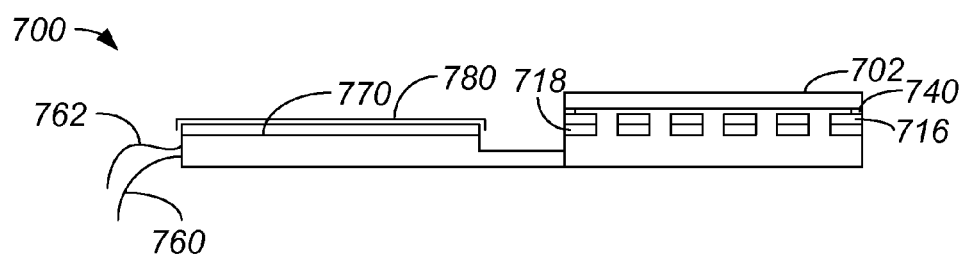
FIG. 7a is a diagrammatic cross-sectional side view representation of a thermophoretic wand which carries an object with a cold shield in a retracted position in accordance with an embodiment of the present invention.
Figure 7B:
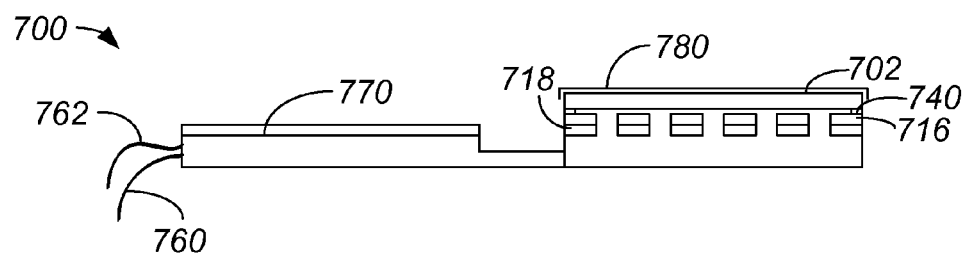
FIG. 7b is a diagrammatic cross-sectional side view representation of a thermophoretic wand, i.e., thermophoretic wand 700 of FIG. 7a, which carries an object with a cold shield in a deployed position to protect the object in accordance with an embodiment of the present invention.

With reference to FIGS. 7a and 7b, one embodiment of a cold shield will be described in accordance with an embodiment of the present invention. A thermophoretic wand 700 includes an head-cooling cold plate 718 and a thermal insulator 716. In the described embodiment, a peripheral seal 740 is arranged between an object 702 carried by wand 700 and thermal insulator 716.

Wand 700 includes a retractable cold shield 780, which may be formed from a metallic material such as copper. When cold shield 780 is not deployed over object 702, cold shield 780 is positioned over a shield-cooling cold plate 770 which is arranged to cool cold shield 780, as shown in FIG. 7a. Shield-cooling cold plate 770 and head-cooling cold plate 718 may both be cooled by a coolant provided through a coolant supply line 762 to a temperature that is at least a few degrees cooler than a desired temperature of object 702. In the described embodiment, since shield-cooling cold plate 770 cools cold shield 780 while cold shield 780 is retracted, the initial temperature and heat capacity of cold shield 780 may be chosen such that cold shield 780 remains colder than object 702 when cold shield 780 is in use. Alternatively, cold shield 780 may be cooled by a flow of coolant or other suitable means.

Cold shield 780 may be held in a retracted position when object 702 is either being loaded or unloaded from wand 700, or when the environment surrounding wand 700 and object 702 is cooler than object 702. When deployed or otherwise positioned over object 702 that is clamped onto wand 700 by a vacuum supplied through a vacuum supply line 760 as shown in FIG. 7b, cold shield 780 generally does not come into direct contact with object 702, though cold shield 780 is typically positioned in close proximity to object 702. Cold shield 780 serves to attract particles (not shown) positioned between cold shield 780 and a top or front surface of object 702 since cold shield 780 is generally cooler than the top surface of object 702. Cold shield 780 also serves to prevent other particles (not shown) from coming into the proximity of object 702 by essentially serving as a physical barrier to the top surface of object 702.

The head of a thermophoretic wand, as well as a cold shield of a wand, may generally be cooled either dynamically or statically. When the head or, more specifically, a cold plate of the head such as cold plate 418 of FIG. 4a, is cooled dynamically or actively, the cold plate may be coupled to a cooling mechanism which allows the cold plate to be cooled while the head is in use. Alternatively, when the head of a wand is cooled statically or passively, the head may be subjected to a cooling process to cool the head, e.g., to a temperature that is approximately at least several degrees cooler than a desired temperature of an object that is intended to be carried by the wand. Then, when the wand is to be used, the cooling process may be ended, and the wand may be used while the cold plate is still cool. With such an arrangement, the heat capacity of the head is typically sufficient to maintain the temperature difference between the head and the object while the wand is in use.

Figure 8A:
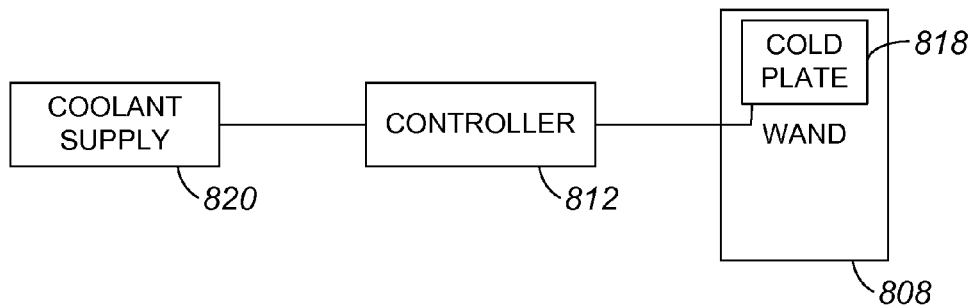
FIG. 8a is a block diagram representation of a system within which a thermophoretic wand is actively cooled by a controlled coolant supply in accordance with an embodiment of the present invention.

FIG. 8a is a block diagram representation of a system within which a thermophoretic wand is dynamically or actively cooled by a controlled coolant supply in accordance with an embodiment of the present invention. A wand 808 which includes at least one cold plate 818 is coupled to a coolant supply 820 which provides a coolant that may circulate through a cold plate 818 of wand 808. Heat transfer generally occurs between the coolant and cold plate 818 to allow the temperature of cold plate 818 to be maintained at a desired level. The temperature of cold plate 818 may be controlled by controller 812. Controller 812, in one embodiment, may control the flow of coolant through cold plate 818 to regulate the temperature of cold plate 818. It should be appreciated, however, that controller 812 may instead control the temperature of cold plate 818 by regulating the temperature of the coolant. To regulate the temperature of the coolant, controller 812 may control the temperature of coolant supply 820.

As previously mentioned, cold plate 818 may be a thermophoretic plate that is formed from a highly conductive material. Highly conductive materials generally include metals, as for example copper. The coolant may be any suitable liquid. Suitable liquids may generally include any liquid which does not transition to a frozen state at a temperature which is desired for cold plate 818. In one embodiment, the coolant may be freon or water.

Figure 8B:
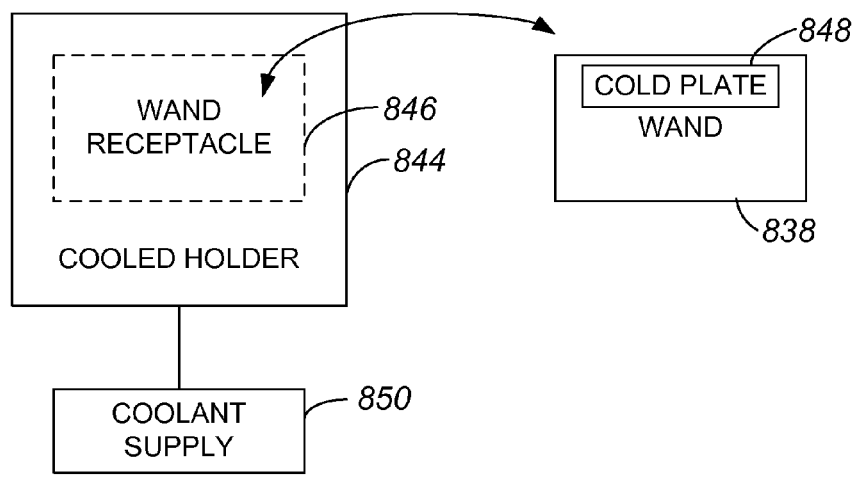
FIG. 8b is a block diagram representation of a system within which a thermophoretic wand is statically cooled by a cooled wand holder coupled to a coolant supply in accordance with an embodiment of the present invention.

Wand 808 is dynamically cooled, as wand 808 is cooled by coolant supplied by coolant supply 820 while wand 808 is being used. With reference to FIG. 8b, one embodiment of a cooled holder which may be used to statically cool a thermophoretic wand will be described in accordance with an embodiment of the present invention. When a wand 838 is to be cooled statically, wand 838 may be placed in a wand receptacle 846 of a cooled holder 844 when wand 838 is not in use. By placing wand 838 in receptacle 846 of cooled holder 844, the temperature of wand 838 may effectively be maintained at a temperature that is approximately the same as that of cooled holder 844. Typically, the temperature of cooled holder 844 is maintained at a level that allows wand 838 to be cooled to a temperature desired for wand 838 or, more specifically, a cold plate 848 in the head of wand 838. Hence, when wand 838 is removed from receptacle 846 after some period of cooling, cold plate 848 will generally be cooled to a temperature that is desired for cold plate 848. It should be appreciated that when a shield-cooling cold plate is included in wand 838, the shield cooling cold plate is also chilled or otherwise cooled while wand 838 is in receptacle 846.

Cooled holder 844 may be coupled to a coolant supply 850 which is arranged to cool cooled holder 844. For example, cooled holder 844 may be a holder through which coolant provided by coolant supply 850 may flow to cool cooled holder 844 and, hence, cold plate 848 of wand 838 when wand 838 is positioned in receptacle 846. In one embodiment, cooled holder 844 may be formed from a block of metal or any suitable material which may be cooled to a desired temperature.

Figure 8C:
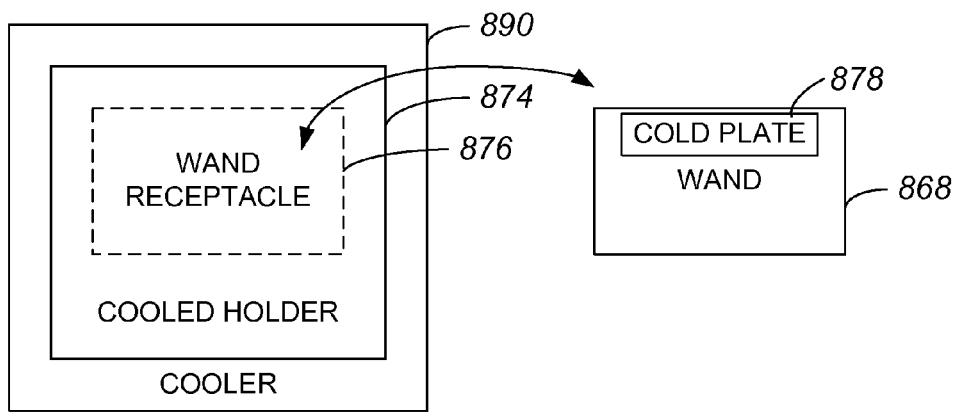
FIG. 8c is a block diagram representation of a system within which a thermophoretic wand is statically cooled by a cooled wand holder which is cooled by a cooler in accordance with an embodiment of the present invention.

Another cooled holder which may be used to statically cool a thermophoretic wand is shown in FIG. 8c. A thermophoretic wand 868 with a cold plate 878 may be placed into a wand receptacle 876 of a cooled holder 874 that is cooled by a cooler 890. Cooled holder 874 may be positioned such that it is substantially in contact with cooler 890 such that heat transfer may occur between cooled holder 874 and cooler 890 to allow the temperature of cooled holder 874 to be maintained at a level that is appropriate to cool cold plate 878 to a desired temperature.

The configuration of cooler 890 may vary widely. By way of example, cooler 890 may be a refrigerator, cooler 890 may be a pool of coolant in which at least a part of cooled holder 874 is immersed, or cooler 890 may be a block of ice. Alternatively cooler 890 may be a thermoelectric cooler. In one embodiment, cooler 890 may transiently cool cooled holder 874, i.e., cooled holder 874 maybe removed from cooler 890 when cooled holder 874 is to be used. When cooler 890 is a refrigerator, for example, cooled holder 874 may be cooled in cooler 890 until such time as wand 868 is to be placed in receptacle 876. Cooled holder 874 may be removed from cooler 890 for use when wand 868 is ready to be positioned in wand receptacle 876. In general, cooler 890 is substantially any apparatus or arrangement which is suitable for chilling cooled holder 874.

Figure 9:
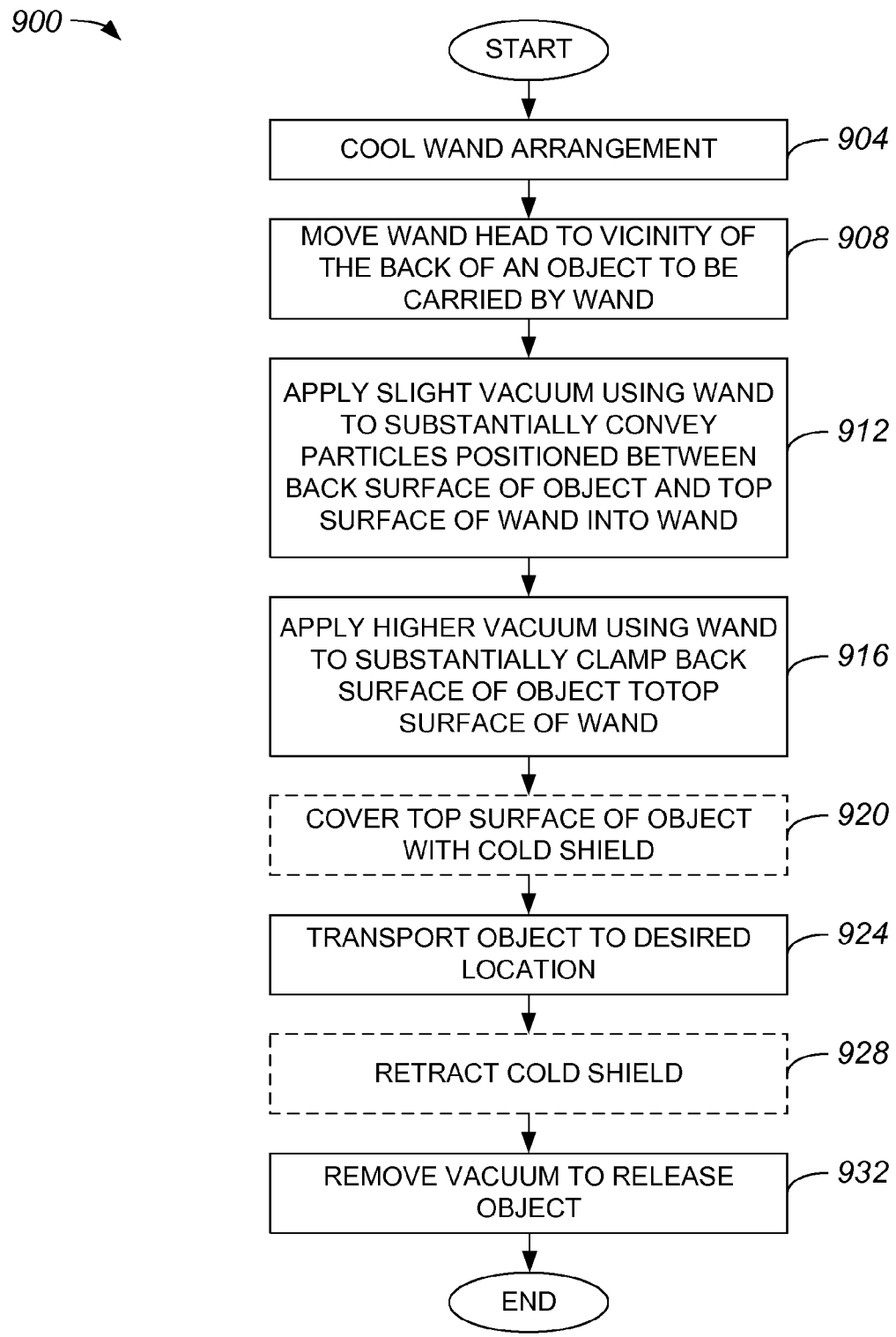
FIG. 9 is a process flow diagram which illustrates the steps associated with utilizing a thermophoretic wand in accordance with an embodiment of the present invention.

FIG. 9 is a process flow diagram which illustrates the steps associated with utilizing a thermophoretic wand arrangement in accordance with an embodiment of the present invention. A process 900 of utilizing a thermophoretic wand arrangement begins at step 904 in which the wand arrangement is cooled. In one embodiment, the wand arrangement includes a cold shield, although it should be appreciated that a wand arrangement may not necessarily include a cold shield. Cooling the wand arrangement may include providing a coolant substantially directly to the wand arrangement, or positioning the wand within a receptacle of a cooled holder. The wand arrangement may be cooled to a temperature that is lower than the desired temperature of an object to be carried by the wand, e.g., to a temperature that is a few degrees lower than the desired temperature of the object. For example, the temperature difference between the wand arrangement and the object may be increased to approximately 5°, approximately 10°, or approximately 20°, to increase the thermophoretic force.

Once the wand arrangement is cooled, the wand head is generally moved to the vicinity of the back or contact surface of an object that is to be carried by the wand in step 908. The object may be substantially any object, as for example a wafer or a reticle. Hence, the back of the object that is to be carried by the wand may be the back surface of a wafer that is exposed during a lithography process, or the opposite surface to the patterned surface of a reticle off of which EUV beams are reflected during a lithography process. As the wand head is brought near the back of the object to be carried, a thermophoretic force is arranged to drive particles away from the back of the object towards a top or contact surface of the wand head.

After the wand head is moved to the vicinity of the back of the object to be carried by the wand arrangement, a slight or relatively weak vacuum is applied using the wand arrangement in step 912. Applying a slight vacuum allows any particles positioned between the back surface of the object and the top surface of the wand ahead to be conveyed substantially into the wand arrangement. That is, a slight vacuum is applied to enable air flow to move particles positioned between the back surface of the object and the top surface of the wand head into holes in the wand head to substantially prevent the particles from being trapped between the back surface of the object and the top surface of the wand head when the surfaces come into contact.

A higher or stronger vacuum is applied to substantially clamp the back surface of the object to the top surface of the wand head in step 916. In one embodiment, the higher vacuum may be applied after contact is made between the back surface of the object and the top surface of the wand head to clamp the object in place. Once the object is clamped into place on the wand head, if the wand arrangement includes a cold shield, the top surface of the object is covered with the cold shield in step 920. Then, in step 924, the object is transported to a desired location using the wand arrangement.

When the object carried by the wand arrangement includes a cold shield, the cold shield may be retracted or otherwise removed in step 928 such that the top surface of the wafer is effectively exposed. The vacuum that clamps the object to the head of the wand arrangement is then removed in step 932 to release the object, thereby completing the process of utilizing a thermophoretic wand arrangement.

Although only a few embodiments of the present invention have been described, it should be understood that the present invention may be embodied in many other specific forms without departing from the spirit or the scope of the present invention. By way of example, instead of including openings in a head portion of a wand like openings 622 of FIGS. 6a and 6b through which vacuum may be applied, vacuum may instead be applied through pinchucks. That is, pinchucks may include openings through which vacuum may be applied. Alternatively, pinchucks through which vacuum may be applied may be used in conjunction with openings such as openings 622 of FIGS. 6a and 6b. The pinchuck area is surrounded by a sealing perimeter to allow the vacuum to be applied.

The size and the shape of a thermophoretic wand may vary widely. For instance, the size and the shape of the head of a wand may vary. Typically, the size of the head or, more particularly, a top surface of the head, has a surface area that is sized to carry either a wafer or a reticle. The shape of the head may, in one embodiment, be approximately the same shape as a wafer or a reticle. It should be appreciated that the size of the front surface of the head may have a surface area that is slightly smaller than the surface area of an object to be carried on the head, slightly larger than the surface area of the object, or approximately the same as the surface area of the object. If a cold shield is included, the cold shield should be large enough to completely cover sensitive areas of the front surface of the object to be carried.

In one embodiment, a thermal insulator may not necessarily be included as a part of the head of a thermophoretic wand. While the use of a thermal insulator is effective in reducing the amount of heat conduction between the head of a wand and an object that is clamped on the head through the use of a vacuum, if there is a relatively insignificant amount of heat conduction that would occur between a cold plate of the wand and the object, a thermal insulator may be substantially eliminated from the wand without departing from the spirit or the scope of the present invention.

A thermophoretic wand which is arranged to maintain the temperature of an object carried by the wand at approximately a desired temperature for the object has generally been described as including a cold shield. The cold shield, in one embodiment, may be arranged to substantially slide from a retracted cooling position to a deployed position when the cold shield is in use, as discussed above. It should be appreciated that the cold shield may instead be a arranged to be completely removed from a wand when the cold shield is not in use, and placed over the head of the wand and an object supported by the head when the cold shield is to be used. That is, the cold shield may be a substantially separate component which is placed over the head of the wand when appropriate.

A cold shield has been described as being cooled by a cold plate while the cold shield is in a retracted position. It should be appreciated, however, that a cold shield may instead be actively cooled. In other words, a cold shield may be cooled while the cold shield is protecting an object from airborne particles, as for example through the use of coolant that flows through the cold shield.

The use of a cold shield is optional. By way of example, a shield may not necessarily be a "cold" shield, and may instead be maintained at an ambient temperature, or a temperature that is approximately the same as the temperature of the environment in which a thermophoretic wand is to be used, rather than being cooled. Alternatively, a shield may not necessarily be used as a part of a thermophoretic wand arrangement. That is, a thermophoretic wand which is arranged to prevent particles from being attracted to one side of an object, i.e., the side of an object which is in substantially direct contact with a head of the wand, may not necessarily include a shield. A shield may not be included, for instance, when the presence of particles on the side of the object that does not contact the head of the wand does not significantly affect the integrity of or the performance of the object. Or, a shield may not be included if it may be ensured that substantially all surrounding surfaces encountered by the object while the object is being manipulated on the wand are cooler than the object.

The methods of using a thermophoretic wand that protects front and back surfaces of an object may vary widely. For example, steps associated with the method of using a thermophoretic wand as described above may be altered, reordered, added, and removed without departing from the spirit or the scope of the present invention. Therefore, the present examples are to be considered as illustrative and not restrictive, and the invention is not to be limited to the details given herein, but may be modified within the scope of the appended claims.

What is claimed is:

1. A method for supporting an object using an apparatus such that particle contamination of a first surface and a second surface of the object is minimized, the object having a first temperature, the apparatus including a first cold plate, a contact surface, at least a first opening defined within the first cold plate, and a vacuum source, the method comprising:

maintaining the first cold plate of the apparatus at a second temperature, the second temperature being less than the first temperature;

positioning the apparatus in proximity to the first surface of the object such that the first surface of the object faces the apparatus;

allowing a first thermophoretic force to convey any particles present between the first surface of the object and the apparatus away from the first surface of the object; and applying a vacuum of a first level through the first opening using the vacuum source to secure the first surface of the object against the contact surface.

2. The method of claim 1 further including:

applying a vacuum of a second level through the first opening using the vacuum source before the first surface is secured against the contact surface, wherein applying the vacuum of the second level conveys the particles present between the first surface of the object and the apparatus into the first opening.

3. The method of claim 1 wherein the apparatus further includes a second cold plate and a shield, and the method further includes:

maintaining the second cold plate at a third temperature, the third temperature being less than the first temperature, wherein maintaining the second cold plate at the third temperature enables the shield to be cooler than the first temperature; and positioning the shield over the second surface of the object, wherein positioning the shield over the second surface of the object allows a second thermophoretic force to convey any particles present between the second surface of the object and the shield to be conveyed away from the second surface of the object.

4. The method of claim 3 wherein maintaining the second cold plate at the third temperature includes circulating a coolant through the second cold plate.

5. The method of claim 1 wherein maintaining the first cold plate at the second temperature includes circulating a coolant through the first cold plate to actively cool the first cold plate.

6. The method of claim 1 further including:

cooling the first cold plate to approximately the second temperature.

7. The method of claim 1 wherein the contact surface is one of a top surface of an insulator arranged to insulate the object from the first cold plate and a top surface of a seal arranged to maintain the vacuum between the first surface of the object and the apparatus.

8. The method of claim 1 further including:
positioning a cooled shield over the second surface of the object, the cooled shield being of a third temperature that is lower than the first temperature, wherein positioning the shield over the second surface of the object allows a second thermophoretic force to convey any particles present near the second surface of the object to be conveyed away from the second surface of the object.

9. The method of claim 1 wherein the apparatus is a thermophoretic wand.

10. A thermophoretic wand for supporting an object such that particle contamination of a first surface and a second surface of the object is minimized, the object having a first temperature, the thermophoretic wand comprising:
a first cold plate, the first cold plate defining a first opening therein, wherein the first cold plate is maintained at a second temperature, the second temperature being less than the first temperature;
a contact surface; and
a vacuum source, the vacuum source being arranged to apply a vacuum of a first level through the first opening to secure the first surface of the object against the contact surface, wherein a first thermophoretic force conveys any particles present between the first surface of the object and the thermophoretic wand away from the first surface of the object.

11. An apparatus for supporting an object such that particle contamination of a first surface and a second surface of the object is minimized, the object having a first temperature, the apparatus comprising:
a first cold plate, the first cold plate defining a first opening therein, wherein the first cold plate is maintained at a second temperature, the second temperature being less than the first temperature;
a contact surface; and
a vacuum source, the vacuum source being arranged to apply a vacuum of a first level through the first opening to secure the first surface of the object against the contact surface, wherein a first thermophoretic force conveys any particles present between the first surface of the object and the apparatus away from the first surface of the object.

12. A thermophoretic wand arrangement for supporting an object such that particle contamination of a first surface and a second surface of the object is minimized, the object having a first temperature, the thermophoretic wand arrangement comprising:
a first cold plate, the first cold plate having a first opening defined therein;
a vacuum source;
a contact surface;
means for maintaining the first cold plate at a second temperature, the second temperature being less than the first temperature;
means for allowing a first thermophoretic force to convey particles present between the first surface of the object and the thermophoretic wand arrangement away from the first surface of the object; and
means for applying a vacuum of a first level through the first opening using the vacuum source to secure the first surface of the object against the contact surface.

* * * * *